United States Patent [19]

Nugent et al.

[11] 3,775,698

[45] Nov. 27, 1973

[54] CIRCUIT FOR GENERATING A HIGH POWER RF SIGNAL HAVING LOW AM AND FM NOISE COMPONENTS

[75] Inventors: John L. Nugent, Baltimore; Harry W. Claypool, Joppa, both of Md.

[73] Assignee: Westinghouse Electric Corporation, Pittsburgh, Pa.

[22] Filed: Aug. 4, 1972

[21] Appl. No.: 277,939

[52] U.S. Cl. ................ 331/75, 331/109, 331/117 R, 331/177 V

[51] Int. Cl. ........................... H03b 3/02, H03b 5/12

[58] Field of Search ........................ 331/74, 75, 109, 331/117 R, 167, 171, 177 V

[56] References Cited

UNITED STATES PATENTS

| | | | |
|---|---|---|---|
| 3,421,111 | 1/1969 | Boyajian | 331/117 R |
| 3,628,183 | 12/1971 | Strenglein et al. | 331/75 X |
| 3,624,541 | 11/1971 | Lundstrom | 331/109 X |
| 3,281,699 | 10/1966 | Harwood | 331/117 R X |

*Primary Examiner*—Roy Lake
*Assistant Examiner*—Siegfried H. Grimm
*Attorney*—F. H. Henson et al.

[57] ABSTRACT

An RF signal generator is disclosed which has low AM and FM noise and high power output. The output signal of the RF signal generator is a variable over an octave in response to a tuning voltage signal. The RF signal generator includes a low noise RF oscillator coupled to a limiter circuit through a first buffer amplifier. A second buffer amplifies the output of the limiter circuit to produce a high level RF output signal. The FM noise is reduced to a low value by a high Q resonant circuit which determines the frequency of the oscillator and by the use of components in the oscillator circuit which have low noise characteristics. The AM noise is further reduced by the limiter and the output of the limiter is amplified by a second buffer to produce a high power low noise RF signal.

4 Claims, 2 Drawing Figures

CIRCUIT FOR GENERATING A HIGH POWER RF SIGNAL HAVING LOW AM AND FM NOISE COMPONENTS

BACKGROUND OF THE INVENTION

1. Field of the Invention

This invention relates to signal generators and more particularly to high power low noise RF signal generators.

2. Description of the Prior Art

Typical prior art RF signal generators either had a relatively limited tuning range or produced a noisy output signal. Crystal controlled oscillators were frequently used in an effort to reduce the FM noise. The active circuits of the oscillator were often designed to have a relatively constant gain in an effort to reduce the AM noise. These noise control techniques limited the frequency of prior art low noise RF signal generators to frequencies near the resonant frequency of the crystal used in the oscillator.

SUMMARY OF THE INVENTION

The preferred embodiment of the invention provides a high power, low noise RF signal generator with the frequency of the output signal being variable over at least an octave. This improved performance is achieved by combining a low noise oscillator circuit whose frequency is variable in response to a tuning voltage with an amplitude limiter and two buffer circuits. The FM and AM noise is reduced by the design of the oscillator while the AM noise is further reduced by the limiter circuit. The oscillator is isolated from the limiter by a first buffer and a second buffer amplifies the output of the limiter to produce a high power low noise RF signal. The basic circuit may be modified to provide manual tuning by using manually variable components in the frequency determining circuits.

More specifically the FM noise of the oscillator is greatly reduced by a high Q frequency determining circuit which comprises an inductor and a capacitor connected in parallel. The output of this resonant circuit is coupled to the gate terminal of an insulated gate transistor such that the loaded and unloaded Q of the circuit are substantially the same. The resonant circuit also includes a voltage controlled capacitor for varying the frequency of the oscillator over at least an octave in response to a tuning voltage.

Bias for the insulated gate transistor is produced by a low noise diode coupled between the gate and source terminals of the insulated gate transistor. This diode is a hot carrier diode. The hot carrier diode has low noise characteristics as compared to diodes commonly used for this purpose. The low noise characteristics of this diode reduces both the AM and FM noise components of the oscillator output signal. The output signal of the oscillator circuit is coupled to a first buffer. The output of the first buffer is coupled to a limiter which removes substantially all of the AM components from the RF signal. The output of the limiter is further amplified by a second buffer to produce a low noise high power RF signal.

The above-described RF signal generator typically has a noise figure of at least −136 db/hz at a frequency of 3 kilohertz removed from the carrier. The FM noise of the RF signal generator is substantially determined by the noise characteristics of the oscillator circuit while the AM noise is substantially determined by the characteristics of the limiter circuit. This separation of the AM and FM noise determining circuits permits the system to be more easily optimized in order to achive a minimal noise figure. Typical RF signal generators of the type disclosed by this invention have a noise figure of at least 25 db better than typical prior art RF signal generators having a similar tuning range and power output.

DESCRIPTION OF THE PREFERRED EMBODIMENT

Figure 1:
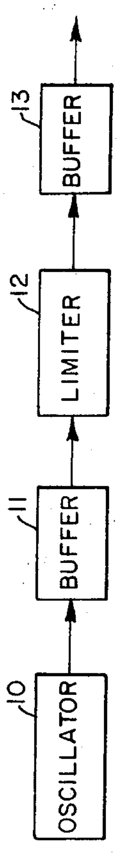
FIG. 1 is a functional block diagram of the RF signal generator.

Fig. 1 is a functional block diagram of the RF signal generator which is the subject of this invention. The RF signal generator includes an oscillator 10 coupled to a firt buffer 11. The output of the first buffer 11 is coupled to a limiter circuit 12 with the output of the limiter coupled to a second buffer 13.

The first buffer 11 isolates the oscillator 10 from the limiter 12 and provides an RF signal to the limiter 12 having an amplitude sufficient to assure proper limiting action. The buffer 11 may be eliminated in specific designs depending on the output signal capabilities of the oscillator 10 and the input signal requirements of the limiter 12. The second buffer 13 further amplifies the output of the limiter circuit 12 to produce a high level low noise RF signal. This buffer may also be eliminated if the output of the limiter is sufficient for the intended application.

Figure 2:
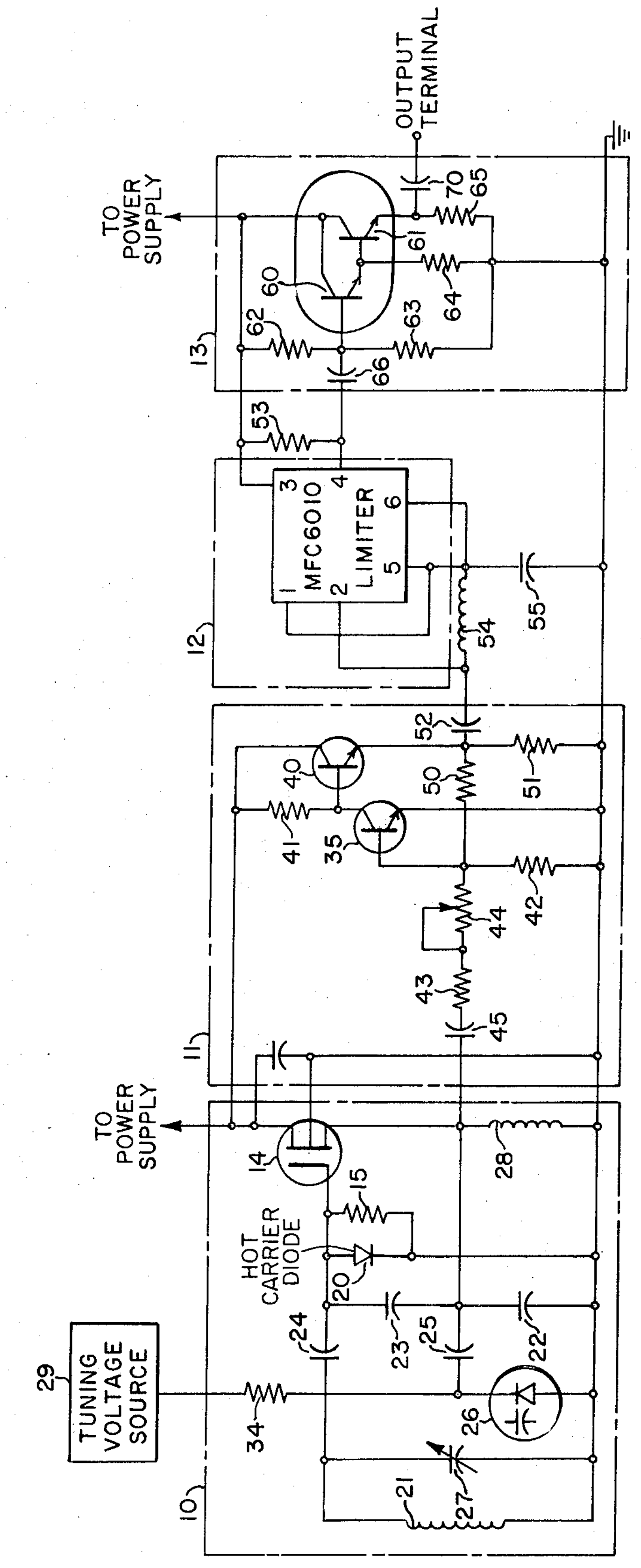
FIG. 2 is a detailed schematic diagram of the RF signal generator.

A detailed schematic diagram of the low noise RF signal generator illustrated functionally in FIG. 1 is shown in FIG. 2. The oscillator 10 includes an active circuit comprising an insulated gate transistor 14, a tuned circuit and a bias network. The bias network comprises a resistor 15 and a diode 20 connected in parallel with the resistor 15. The diode 20 conducts on the positive peaks of the RF signal to produce a bias voltage at the gate terminal of the insulated gate transistor 14. The resonant circuit which determines the frequency of the oscillator includes an inductor 21 and capacitors 22 through 27. Capacitor 24 isolates the DC bias voltage produced at the gate terminal of the insulated gate transistor 14 so that it is not shorted out by the inductor 21. The remainder of the capacitors form the frequency determining capacitive elements of the resonant circuit. Manually variable components can be used in the resonant circuit, if manual tuning is desirable.

An inductor 28 is connected between the source terminal of the insulated gate transistor 14 and the ground terminal of the oscillator. The junction of capacitors 22 and 23 is connected to the junction of inductor 28 and the source terminal of the insulated gate transistor 14 to form a feedback path which causes the circuit to oscillate.

Capacitor 26 is a varactor diode whose capacitance has a predetermined relationship to the output voltage of the tuning voltage source 29. By varying the output voltage of the tuning voltage source 29 the frequency of the oscillator 10 can be changed over its operating range. The junction of capacitors 25 and 26 is isolated from the tuning voltage source 29 by an isolation resistor 34.

The RF output signal of the oscillator 10 is available at the junction of inductor 28 and the source terminal of the insulated gate transistor 14. This signal is coupled to the input of the first buffer 11.

The first buffer amplifier 11 includes two bi-polar transistors 35 and 40. The first bi-polar transistor 35 is a voltage gain stage which includes a load resistor 41 and a bias resistor 42. The base terminal of transistor 35 is coupled to the output of the oscillator 10 by two resistors 43 and 44, and a capacitor 45 connected in series. Resistor 44 is variable to adjust the gain or the first buffer amplifier 11 so that the output signal of this buffer amplifier has the desired value. The second transistor 40 is an emitter follower stage and is included to provide power gain. The emitter terminal of the second transistor 40 is coupled to the base terminal of the first transistor 35 through a feedback resistor 50 to stabilize the gain of the first buffer emplifier 11. An emitter resistor 51 is coupled between the emitter terminal of the second transistor 40 and the ground terminal of the first buffer amplifier 11 and the output signal is coupled to the limiter 12 through a capacitor 52.

The limiter 12 may be a standard integrated circuit sold by Motorola which is identified by Motorola part Number MFC6010. This circuit is shown properly connected in FIG. 2.

The output signal of the above-described limiter circuit is available at terminal 4 of the integrated circuit and is coupled to the input terminal of the second buffer 13. Resistor 53, an inductor 54 and a capacitor 55 provides bias signals to the limiter circuit 12.

The active elements of the second buffer amplifier 13 comprise two Darlington connected transistors 60 and 61. The output signal of the limiter 12 is coupled to the base terminal of the first transistor 60 by a capacitor 66. Bias is provided to these transistors by two resistors 62 and 63. The emitter of the first transistor 60 is returned to the ground terminal of the second buffer 13 by a resistor 64. The emitter of the second transistor 61 is similarly returned to ground by a second resistor 65. A coupling capacitor 70 is coupled to the junction formed by the emitter of the second transistor 61 and a resistor 65 which couples the emitter of this transistor to the ground terminal of the second buffer 13. The coupling capacitor 70 isolates the DC voltage present at the emitter of transistor 61 from the output terminal to assure that only the RF signal is coupled to the output terminal of the RF signal generator.

In selecting components for the above-described RF signal generator the inductor 21 should have a high Q and capacitors 22 through 27 should have low losses to assure that the resonant circuit has a high Q. The input impedance of the insulated gate transistor 14 is relatively high thereby assuring that the loaded and unloaded Q of the resonant circuit are substantially the same. This assures a high loaded Q for this circuit resulting in low FM noise. The bias diode 20 is preferably a Hewlett Packard hot carrier diode. This diode has the lowest 1/F noise of any diode currently available on the market. The value of the various tuning capacitors are chosen such that the oscillator will have the proper frequency and tuning range. Using currently available components the disclosed oscillator will successfully oscillate at a frequency range of between 1 and 500 megahertz and be variable over at least an octave. It should be emphasized however that these limits are imposed by the availability of suitable components and that the basic design of the RF signal generator is not so limited.

The system as disclosed in detail in FIG. 2 typically has a noise figure of −136 db at 3 KHz removed from the carrier and has a power output of at least +12 dbm into a 50 ohm load. This is a noise figure at least 25 db better than prior art voltage controlled RF signal generators having a similar tuning range.

What is claimed is:

1. A low noise RF signal generator comprising, in combination:

a. an active circuit comprising an insulated gate transistor having a gate terminal, a source terminal and a drain terminal, a bias network including a resistor and a hot carrier diode connected in parallel therewith, a load impendance, said bias network being coupled between said gate terminal of said insulated gate transistor and the ground terminal of said active circuit, said drain terminal being connected to a power supply, said load impedance being coupled between said source terminal of said insulated gate transistor and the ground terminal of said active circuit with the junction of said source terminal and said load impedance forming the output terminal of said active circuit;

b. a parallel tuned circuit comprising an inductor and a capacitor connected in parallel, said tuned circuit being coupled to the gate terminal of said transistor and to the ground terminal of said active circuit;

c. a feedback circuit coupling the output of said active circuit to the gate terminal of said transistor to form an oscillator circuit; and d. a limiter coupled to receive the output signal of said oscillator and generate therefrom a low noise RF signal.

2. The RF signal generator of claim 1 wherein said parallel tuned circuit includes a voltage controlled capacitor permitting the frequency of said oscillator to be varied in response to a voltage signal.

3. The oscillator of claim 1 further including a buffer amplifier disposed between said active circuit and said limiter.

4. The oscillator of claim 3 wherein said buffer amplifier includes a gain control thereby permitting the input signal to said limiter to be adjusted.

* * * * *